(12) United States Patent
Ding

(10) Patent No.: US 6,967,138 B2
(45) Date of Patent: Nov. 22, 2005

(54) PROCESS FOR MANUFACTURING A SUBSTRATE WITH EMBEDDED CAPACITOR

(75) Inventor: Yi-Chuan Ding, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 10/867,690

(22) Filed: Jun. 16, 2004

(65) Prior Publication Data

US 2004/0259317 A1 Dec. 23, 2004

(30) Foreign Application Priority Data

Jun. 19, 2003 (TW) ................ 92116662 A

(51) Int. Cl.[7] ........................................ H01L 21/8242
(52) U.S. Cl. ................. 438/253; 438/397; 438/387; 438/638; 438/210; 438/295; 257/295; 257/296
(58) Field of Search ................. 438/253, 397, 438/387, 638, 210, 238; 257/296, 295, 700, 257/703

(56) References Cited

U.S. PATENT DOCUMENTS 5,814,366 A * 9/1998 Fukuta et al. ............... 361/313
6,021,050 A 2/2000 Ehman et al. ............... 361/793
6,258,649 B1 * 7/2001 Nakamura et al. .......... 438/238
6,642,563 B2 * 11/2003 Kanaya ........................ 257/296
2003/0102153 A1 * 6/2003 Sugaya et al. .............. 174/256

FOREIGN PATENT DOCUMENTS

CN 440993 6/2001

* cited by examiner

Primary Examiner—W. David Coleman

Assistant Examiner—Victor V. Yevsikov

(74) Attorney, Agent, or Firm—Troxell Law Office, PLLC

(57) ABSTRACT

A process for manufacturing a substrate with an embedded capacitor is disclosed. A first metal wiring layer including a lower electrode pad is formed on a substrate base. A dielectric layer is formed a on the substrate base by build-up coating. A hole is formed in the dielectric layer to expose the lower electrode pad, then a medium material is filled into the hole. The medium material is ground to have a ground surface coplanar to the dielectric layer. A second metal wiring layer including an upper electrode pad is formed on dielectric layer, the upper electrode pad covers the ground surface of the medium material and is parallel to the lower electrode pad so as to form an embedded capacitor.

5 Claims, 5 Drawing Sheets

PROCESS FOR MANUFACTURING A SUBSTRATE WITH EMBEDDED CAPACITOR

FIELD OF THE INVENTION

The present invention relates to a method for manufacturing a substrate for IC, particularly to a process for manufacturing a substrate with an embedded capacitor.

BACKGROUND OF THE INVENTION

It is understood that conventional passive components, such as capacitors, resistors or inductors, are separately manufactured to be individual passive components for mounting on a substrate. In order to answer the strict requirements including electrical conductivity and elements simplification in the semiconductor packaging field, the passive components, especially capacitor, should be integrated into a printed circuit board (IC substrate).

A method for manufacturing a multi-layer substrate with embedded capacitor is disclosed in R.O.C. Taiwan Patent No. 440,993. A plurality of through holes are formed in a dielectric layer and pass through upper/lower metal layers. The lower metal layer is used as a ground layer without traces. A medium material is filled into the holes of the dielectric layer and the upper metal layer. Then the upper metal layer is etched to form traces. It is essential that a plating layer is formed on the upper metal layer by copper plating to cover the holes of the upper metal layer in order to form embedded capacitors. In accordance with this known manufacturing method, the upper/lower metal layers on the dielectric layer cannot directly provide the upper/lower electrode pads of the embedded capacitors due to the holes. Moreover it is difficult to manufacture the plating layer covering the medium material to be flat, that is because that the filling quantity of the medium material in each hole cannot be controlled to be equal and even. Therefore, the plating layer and the upper metal layer having holes are combined as upper electrode pads of the embedded capacitors, the holes of the upper metal layer change the shape of the upper electrode pads like "II" shaped in cross-section. The value of the embedded capacitor is unable to be controlled, thereby affecting the capacity of build-in capacitor.

Another printed circuit board with embedded capacitor is disclosed in U.S. Pat. No. 6,021,050. Referring to FIG. 1, the printed circuit board (PCB) 100 includes a plurality of glass fiber reinforced resin layers 111, 112, 113. A plurality of intermediate layers 121, 122, such as B-stage thermal setting resin, are provided and placed between the resin layers 111, 112, 113 in order to compress and adhere the resin layers 111, 112, 113 together. Furthermore, a plurality of via holes 160 are formed in the PCB 100 and pass through the resin layers 111, 112, 113. There are embedded capacitors 130, embedded inductors 140 and embedded resistors 150 formed inside the intermediate layers 121, 122, wherein each embedded capacitor 130 includes an upper and lower electrode pads 132, 131 and a medium material 133 between the upper/lower electrode pads 132, 131. Since the PCB 100 is formed by laminated method, the lower electrode pad 131 needs to be placed on the upper surface of the lower resin layer 112 or 113 in advance and the upper electrode pad 132 needs to be placed on the lower surface of the upper resin layer 111 or 112 in advance prior to lamination. Also a plurality of traces 114 are formed on the upper surface of the resin layers 111, 112, 113. Accordingly, the compressing surface of the resin layers 111, 112, 113 is non-planar, resulting in a difficult lamination. The intermediate layers 121, 122 may easily cause overflow or insufficiency to produce bubbles with respect to the medium material 133. Referring to FIG. 1, there is no trace formed on the lower surface of the resin layers 111, 112, 113, except for the upper electrode pads 132 in order to slightly lessen laminating problem. But that will increase the number of wiring layers of the PCB 100, so that the PCB 100 is not suitable as a high density IC substrate. Furthermore, the resin layers 111, 112, 113 cannot be precisely positioned during laminating process, that is to say, the upper and lower electrode pads 132, 131 should be larger in design.

SUMMARY

The primary object of the present invention is to provide a process for manufacturing a substrate with an embedded capacitor. When finishing a forming step of dielectric layer and a filling step of a medium material, a step of grinding the medium material is executed. The medium material has a ground surface coplanar to the dielectric layer for forming a parallel upper electrode pad on the medium material so as to manufacture an embedded capacitor inside the substrate.

The secondary object of the present invention is to provide a process for manufacturing a substrate with an embedded capacitor. A dielectric layer is formed on the substrate base by build-up coating. A hole is formed in the dielectric layer for filling a medium material. The medium material can be filled into the hole of the dielectric layer to solve the problems of overflow or insufficiency of the medium material caused by the conventional laminated method.

The third object of the present invention is to provide a process for manufacturing a substrate with an embedded capacitor. A metal wiring layer is formed on the dielectric layer after filling the medium material. The metal wiring layer includes an upper electrode pad covering the medium material and being parallel to a lower electrode pad so as to provide an embedded capacitor and to decrease the number of wiring layer of IC substrate with embedded capacitor.

The process for manufacturing a substrate with embedded capacitor in accordance with the present invention comprises the steps as follows. Initially, a substrate base is provided, such as single-layer PCB or multi-layer PCB. Thereafter, a first metal wiring layer is formed on the surface of the substrate base and includes at least a lower electrode pad. Next, a dielectric layer is formed on the surface of the substrate base to cover the first metal wiring layer by build-up coating. At least a hole is formed in the dielectric layer to expose the lower electrode pad. Next, a medium material is filled into the hole of the dielectric layer. Then, the medium material is ground to have a ground surface coplanar to the dielectric layer. Then, a second metal wiring layer is formed on the dielectric layer and includes at least an upper electrode pad. The upper electrode pad covers on the ground surface of the medium material and is parallel to the lower electrode pad to form an embedded capacitor. Besides, the second metal wiring layer further includes a wiring structures or another lower electrode pad of another embedded capacitor.

DETAILED DESCRIPTION OF THE PRESENT INVENTION

Figure 1:
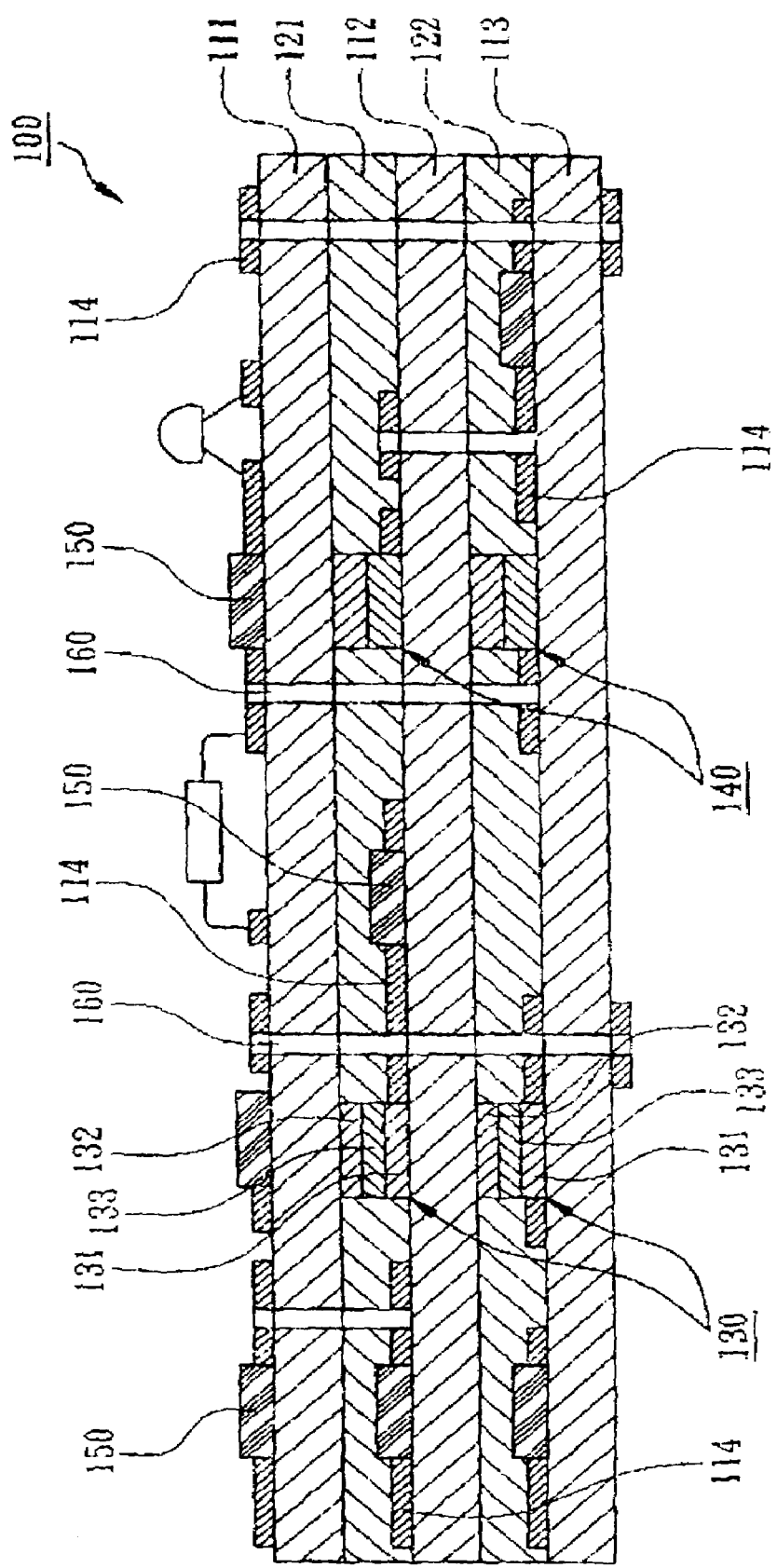
FIG. 1 is a cross-sectional view of conventional printed circuit board with embedded capacitor.

Referring to the drawings attached, the present invention will be described by means of the embodiments below.

Figure 2:
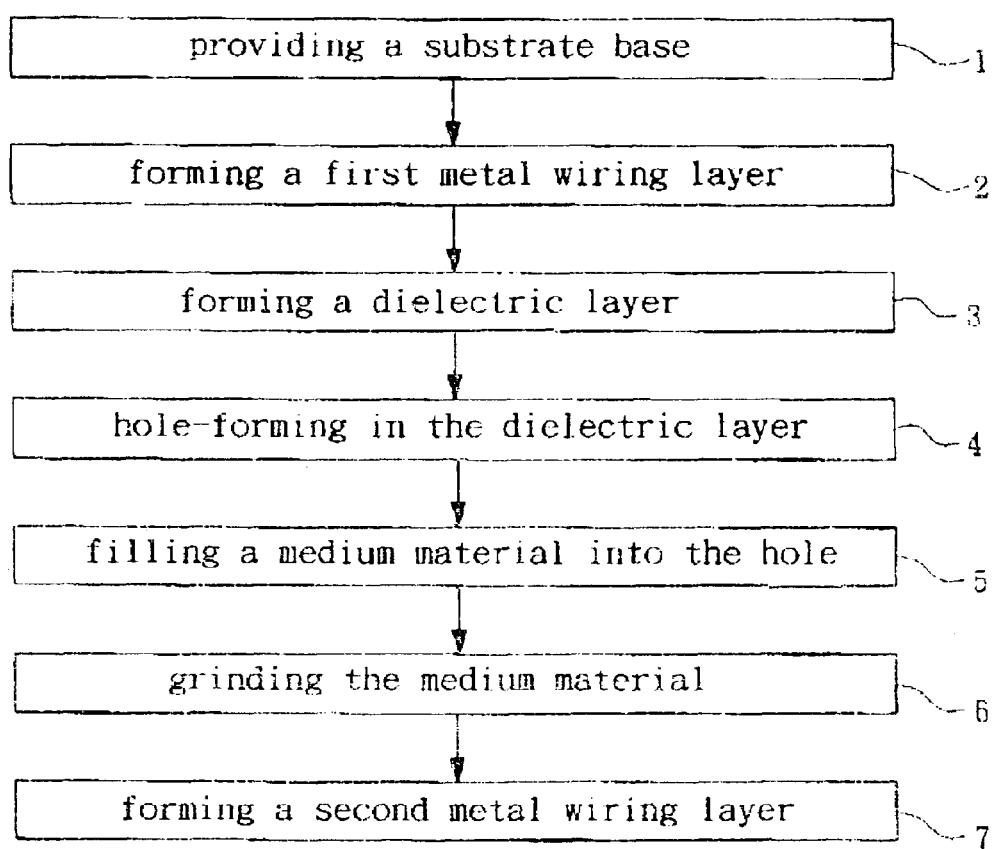
FIG. 2 is a flow chart of manufacturing a substrate with an embedded capacitor in accordance with the present invention.

Referring to FIG. 2, the process for manufacturing a substrate with an embedded capacitor in accordance with the present invention mainly comprises: the step 1 of "providing a substrate base", the step 2 of "forming a first metal wiring layer", the step 3 of "forming a dielectric layer by build-up coating", the step 4 of "hole-forming in the dielectric layer", the step 5 of "filling a medium material into the hole", the step 6 of "grinding the medium material" and the step 7 "forming a second metal wiring layer".

Figure 3A:
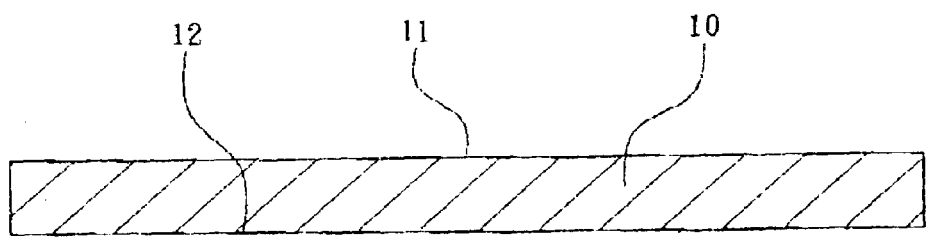
FIG. 3A to FIG. 3G are cross-sectional views of a substrate during the steps of the process for manufacturing a substrate with embedded capacitor of the present invention.
Figure 3B:
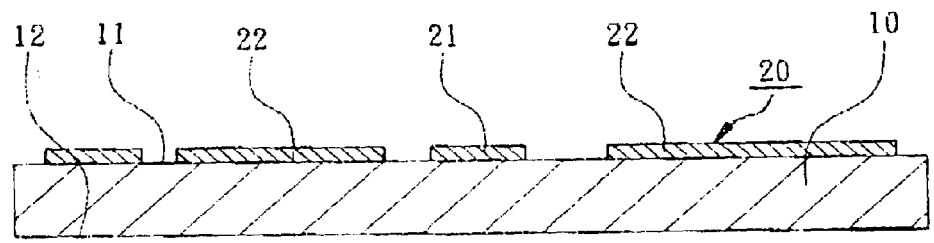

Referring to FIG. 3A, in the step 1, a substrate base 10 is provided. The substrate base 10 has an upper surface 11 and a lower surface 12, wherein the substrate base 10 may be a glass fiber reinforced resin layer, a single-layer PCB, multi-layer PCB with circuit pattern or a core. Referring to FIG. 3B, in the forming step 2, a first metal wiring layer 20 is formed on the upper surface 11 of the substrate base 10, wherein the first metal wiring layer 20 includes at least a lower electrode pad 21 and a plurality of proper traces 22. The forming step 2 may includes a metal depositing step and a metal etching step.

Figure 3C:
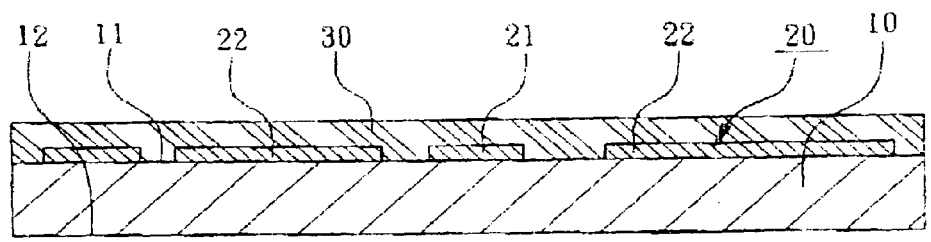
Figure 3D:
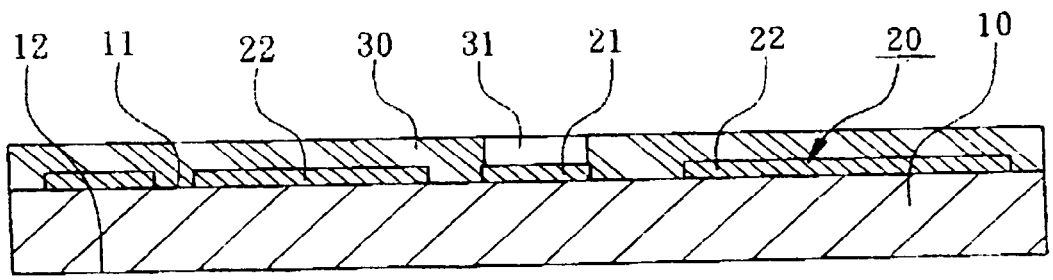

Thereafter referring to FIG. 3C, the forming step 3 is executed. A dielectric layer 30, such as polyimide or epoxy resin, is formed on the upper surface 11 of the substrate base 10 by means of a build-up coating method. Preferably, the dielectric layer 30 may be a B-stage thermal setting resin with low dielectric constant and photosensitive. The dielectric layer 30 covers the lower electrode pad 21 and the traces 22 of the first metal wiring layer 20. Next referring to FIG. 3D, the hole-forming step 4 is executed. At least a hole 31 is formed in the dielectric layer 30 by means of laser-drilling, etching or photolithography technique to expose the lower electrode pad 21. The hole 31 can be smaller than the lower electrode pad 21.

Figure 3E:
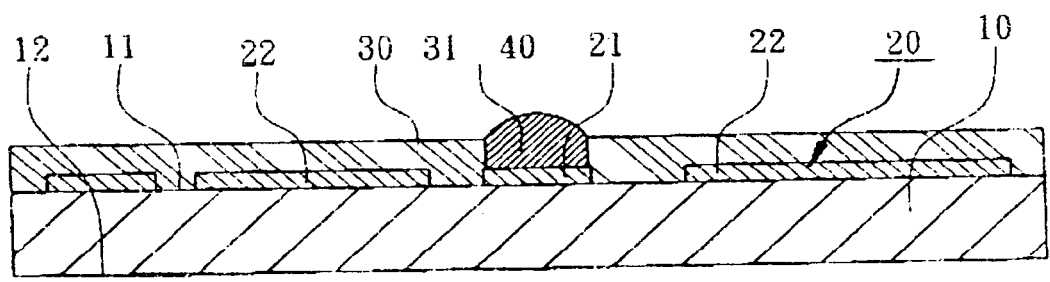
Figure 3F:
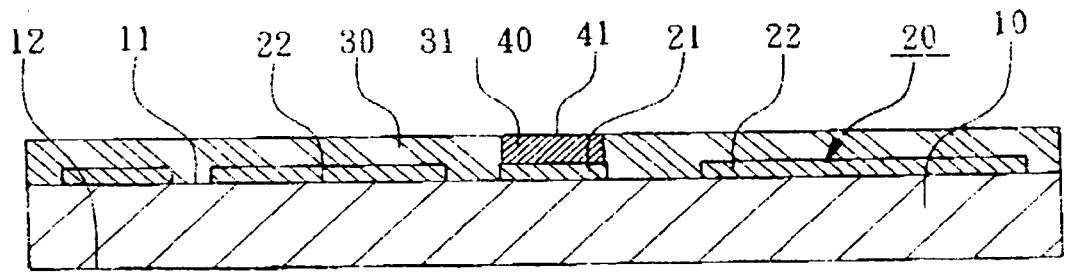
Figure 3G:
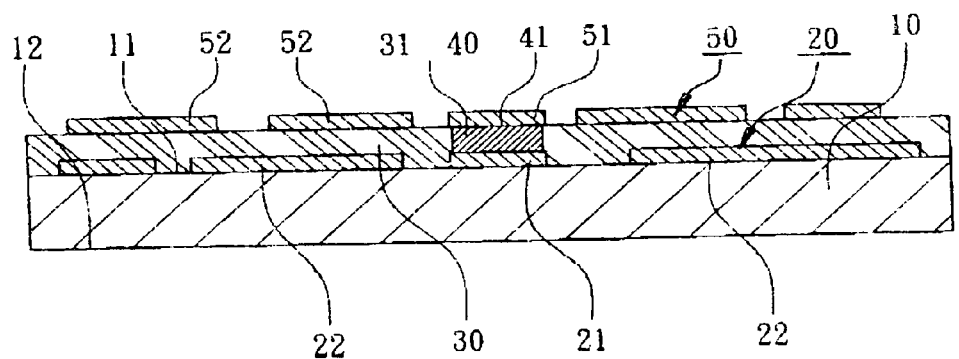

Referring to FIG. 3E, the filling step 5 is executed. A medium material 40 is filled into the hole 31 of the dielectric layer 30 by means of printing or potting technique. Preferably, the medium material 40 is fully filled into the hole 31 and slightly protrudes from the dielectric layer 30. The medium material 40 means a capacitance material has a high dielectric constant higher than 20. The medium material 40 may consisting of an inorganic ceramic powder (nano-powder is better in this embodiment) and a high dielectric constant compound mixed. The medium material 40 can be selected from the group comprising Ta2O5, MnO2, Nb2O5, BaTiO3 and SrTiO3. Then referring to FIG. 3F, the grinding step 6 is executed. The medium material 40 is ground to have a ground surface 41 coplanar to the dielectric layer 30, and if necessary the dielectric layer 30 also can be ground with the medium material 40. However, in the preferred embodiment, the medium material 40 is ground until a top surface 41 of the medium material 40 is coplanar with a top surface of the dielectric layer 30, wherein the thickness of the dielectric layer is not changed. Referring to FIG. 3G, the forming step 7 is executed. A second metal wiring layer 50, such as a copper layer, is formed on the dielectric layer 30 by electroplating or sputtering technique and patterned by etching technique so that the second metal wiring layer 50 includes at least an upper electrode pad 51 and a plurality of traces 52. The upper electrode pad 51 covers the ground surface 41 of the medium material 40 and is parallel to the lower electrode pad 21 to form an embedded capacitor inside the substrate.

Figure 4:
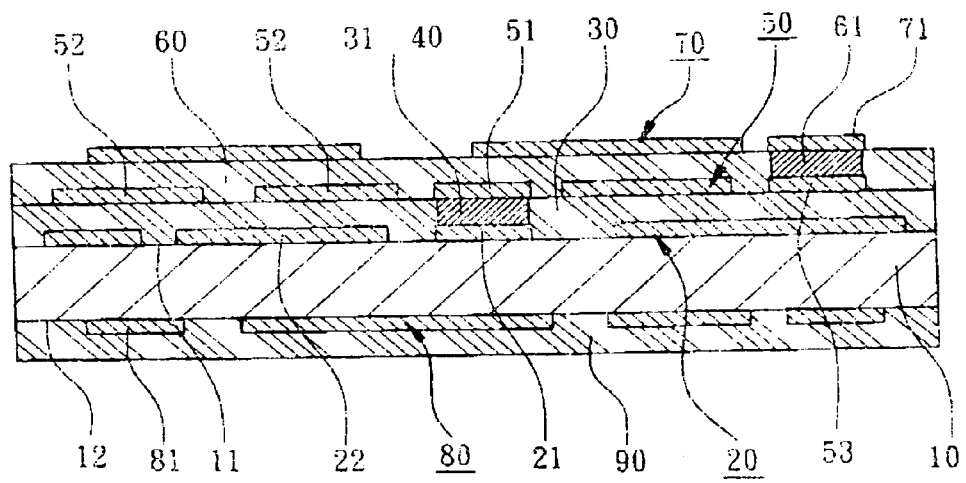
FIG. 4 is a cross-sectional view of the substrate with an embedded capacitor in accordance with the present invention.

Therefore according to the process for manufacturing a substrate with an embedded capacitor of the present invention, the upper electrode pad 51 covers the ground surface 41 of the medium material 40 so that essentially the upper electrode pad 51 is also parallel to the lower electrode pad 21. Besides the medium material 40 can be fully filled into the hole 31 of the dielectric layer 30 to enable the upper and the lower electrode pads 51, 21 to electrically charge more evenly in the manufacturing process for improving electrically charging ability of embedded capacitor. Moreover, the embedded capacitor is build-up manufactured one-by-one in accordance with the process, from the step 1 to the step 7 can be repeatedly executed to manufacture a plurality of necessary embedded capacitors, resistors and inductors. Compared with the known laminated method, the process for manufacturing a substrate with embedded capacitor of the present invention can further prevent the medium material 40 from overflow or insufficiency. Furthermore a plurality of traces 52 and the upper electrode pad 51 of the embedded capacitor can be formed in a same second metal wiring layer 50. A lower electrode pad 53 of another embedded capacitor also can be formed on the second metal wiring layer 50 (referring to FIG. 4). Therefore, the lower electrode pad 53 of the upper embedded capacitor is integrated in a same metal wiring layer 50. Another embedded capacitor can be formed by the lower electrode pad 53, the medium material 61 in the dielectric layer 60 and the upper electrode pad 71 of the upper metal wiring layer 70. The number of circuit layer of the substrate with embedded capacitor can be effectively decreased. The process mentioned above is especially applied to manufacture a build-up substrate with embedded capacitor as a chip carrier of a semiconductor package.

Besides, the process for manufacturing substrate with embedded capacitor in accordance with the present invention is basically unlimited to manufacture embedded capacitor on single surface of substrate base. In accordance with this manufacturing process as referring to FIG. 4, the lower surface 12 of the substrate base 10 is also able to form a metal wiring layer 80 having an electrode pad 81 and a dielectric layer 90 formed by the foregoing manufacturing process. The embedded capacitor formed by the steps mentioned above not only can be formed on the upper surface of the substrate base but also can formed on the lower surface of surface of substrate base.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A process for manufacturing a substrate with an embedded capacitor comprising the steps of:
    providing a substrate base having a surface;
    forming a first metal wiring layer on the surface of the substrate base, the first metal wiring layer including a lower electrode pad and plurality of traces;

forming a dielectric layer on the surface of the substrate base;

forming a hole in the dielectric layer to expose the lower electrode pad;

filling a medium material into the hole of the dielectric layer, wherein the medium material is fully fitted into the hole of the dielectric layer and slightly protrudes from the dielectric layer in the filling step of the dielectric constant material;

grinding the medium material until a top surface of the medium material is coplanar with the top surface of the dielectric material, wherein the thickness of the dielectric material is not changed; and forming a second metal wiring layer on the dielectric layer, the second metal wiring layer including an upper electrode pad, the upper electrode pad covering the top surface of the medium material and being parallel to the lower electrode pad so as to form an embedded capacitor.

2. The process in accordance with claim 1, wherein the medium material is filled by printing or potting.

3. The process in accordance with claim 1, wherein the second metal wiring layer is formed by electroplating or sputtering.

4. The process in accordance with claim 1, further comprising a step of forming a second embedded capacitor on the second metal wiring layer, the second metal wiring layer further including a plurality of traces and a lower electrode pad of the second embedded capacitor.

5. The process in accordance with claim 1, wherein the substrate is a build-up substrate.

* * * * *